United States Patent
Huckins et al.

(10) Patent No.: US 6,731,163 B2
(45) Date of Patent: May 4, 2004

(54) MILLER DE-COMPENSATION FOR DIFFERENTIAL INPUT, DIFFERENTIAL OUTPUT AMPLIFIER

(75) Inventors: Kevin A. Huckins, Tucson, AZ (US); Haibing Zhang, Tucson, AZ (US); Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/094,328

(22) Filed: Mar. 8, 2002

(65) Prior Publication Data

US 2003/0169104 A1 Sep. 11, 2003

(51) Int. Cl.$^7$ ................................................. H03F 3/45
(52) U.S. Cl. .............................. 330/69; 330/9; 330/292
(58) Field of Search ........................... 330/9, 51, 69, 330/292

(56) References Cited

U.S. PATENT DOCUMENTS

| | | | | |
|---|---|---|---|---|
| 4,047,122 A | * | 9/1977 | Rao ............................. 330/69 |
| 4,513,251 A | | 4/1985 | Vyne ........................... 330/292 |
| 4,829,265 A | | 5/1989 | Susak .......................... 330/253 |
| 5,332,931 A | * | 7/1994 | Crispie et al. ................. 327/67 |
| 5,365,199 A | | 11/1994 | Brooks ......................... 330/291 |
| 5,410,273 A | | 4/1995 | Brehmer et al. ............. 330/253 |
| 5,485,121 A | | 1/1996 | Huijsing et al. ............. 330/260 |
| 5,486,790 A | | 1/1996 | Huijsing et al. ............. 330/260 |
| 5,631,598 A | | 5/1997 | Miranda et al. ............. 330/254 |
| 5,670,910 A | | 9/1997 | Kato ............................ 330/253 |
| 5,745,010 A | | 4/1998 | Miyamoto et al. .......... 330/294 |
| 5,796,295 A | | 8/1998 | Sharpe-Geisler ............ 327/541 |
| 5,796,985 A | | 8/1998 | O'Brien et al. ............. 395/500 |
| 5,854,573 A | | 12/1998 | Chan ........................... 330/292 |
| 5,877,654 A | | 3/1999 | Fong et al. .................. 330/292 |
| 5,973,564 A | | 10/1999 | Ivanov ......................... 330/271 |
| 6,002,299 A | | 12/1999 | Thomsen ........................ 330/9 |
| 6,054,880 A | | 4/2000 | Barou .......................... 327/109 |
| 6,150,884 A | | 11/2000 | Fattaruso ..................... 330/257 |
| 6,307,434 B1 | * | 10/2001 | Brambilla et al. ........... 330/146 |
| 6,316,922 B1 | * | 11/2001 | Sugahara et al. ............ 323/224 |

* cited by examiner

*Primary Examiner*—Khanh Van Nguyen
(74) *Attorney, Agent, or Firm*—W. Daniel Swayze, Jr.; W. James Brady; Frederick J. Telecky, Jr.

(57) ABSTRACT

A Miller de-compensation technique and circuit is provided for a differential input, differential output (DIDO) amplifier that facilitates increased differential mode bandwidth while maintaining common-mode and differential mode stability. An exemplary differential input, differential output (DIDO) amplifier comprises a pair of op amps having a compensation capacitance circuit. The compensation capacitance circuit is configured to distinguish between differential mode signals and common mode signals, and to reduce the effects of compensation capacitance during differential mode operation, but allow the effects of compensation capacitance to remain present during common mode operation. As a result, the amount of compensation capacitance can be configured such that common mode stability can be maintained without reducing differential mode bandwidth. The DIDO amplifier can be configured as a programmable gain amplifier or a fixed gain amplifier. In addition, the compensation capacitance circuit can be configured with a switched-capacitor network for selectively cross-coupling compensation capacitors for de-compensation.

24 Claims, 7 Drawing Sheets

MILLER DE-COMPENSATION FOR DIFFERENTIAL INPUT, DIFFERENTIAL OUTPUT AMPLIFIER

FIELD OF INVENTION

The present invention relates to operational amplifiers. More particularly, the present invention relates to a Miller de-compensation technique and circuit for a differential input, differential output (DIDO) amplifier that provides increased differential mode bandwidth while maintaining common-mode and differential mode stability.

BACKGROUND OF THE INVENTION

The demand for improved amplifiers, such as differential input, differential output amplifiers (DIDO's), continues to increase. DIDO amplifiers are frequently being used in instrumentation applications, as well differential transmitter and receiver, and differential driver applications. DIDO amplifiers, like any other amplifier configuration, are required to have good common-mode stability for operation. However, this necessity to maintain good common-mode stability typically comes at the expense of narrower bandwidth in differential mode operation, as described in the following three paragraphs.

Op-amps frequently serve a constituent blocks to DIDO amplifiers. In particular, multistage op-amps, while useful in realizing DIDO amplifiers, exhibit a high-frequency excess phase that requires the op-amps to be frequency-compensated (hereinafter referred to as, "compensated") according to the most stringent stability condition present in the feedback environment in which the op-amps operate. One compensation technique commonly used in op-amps to facilitate stability is that of Miller effect compensation which includes the use of capacitance devices, e.g., a compensation capacitor, coupled in a feedback path between a feedback compensation node configured within the op-amp and an output of the op-amp. Miller compensation capacitors are generally configured to facilitate a well-controlled 20 dB/decade frequency roll-off in the frequency response of the op-amp.

For example, with reference to FIG. 1, a differential input/differential output amplifier 100 is illustrated. Amplifier 100 comprises a first op-amp $A_1$ and a second op-amp $A_2$ having non-inverting input terminals IN1 and IN2 configured as a differential input port, and output terminals OUT1 and OUT2 configured as a differential output port. A pair of resistors $R_1$ and $R_2$ is configured in a feedback arrangement between inverting input terminals of first op-amp $A_1$ and second op-amp $A_2$ and output terminals OUT1 and OUT2, respectively. In addition, a spanning resistor $R_0$ can be suitably coupled between the inverting input terminals of first op-amp $A_1$ and second op-amp $A_2$ in order to increase the DIDO amplifier gain above unity. As discussed, a pair of Miller compensation capacitors $C_{C1}$ and $C_{C2}$ is configured from feedback the compensation nodes of first op-amp $A_1$ and second op-amp $A_2$ to output terminals OUT1 and OUT2, respectively.

Miller compensation capacitors $C_{C1}$ and $C_{C2}$ generally are chosen such that first op amp $A_1$ and second op-amp $A_2$ be compensated for unity-gain stability to avoid a common-mode oscillation at output terminals OUT1 and OUT2. For unity gain stability, first op amp $A_1$ and second op amp $A_2$ can require, for example, 55 pF of compensation from compensation capacitors $C_{C1}$ and $C_{C2}$ based upon a customary measure of stability. (This measure may be, for instance, 45 degrees of phase margin.) Unfortunately, for differential-mode gains greater than unity, the differential mode response is overcompensated, resulting in narrower than optimal differential mode bandwidth.

DIDO amplifiers can be configured in various applications, including applications comprising fixed-gain amplifiers and applications comprising programmable gain amplifiers. In a fixed-gain application, such as can be illustrated with reference again to FIG. 1, resistor $R_0$ provides a fixed resistance, and thus a fixed gain, to DIDO amplifier 100. Meanwhile, programmable gain amplifiers are ideal for applications where input signal levels can vary. Programming of the desired gain may be accomplished through mechanical means. Such programmable gain amplifiers can include a readily configurable gain device, such as that illustrated in FIG. 3 including a variable resistance device $R_0$ within an amplifier 300. However, typical communication applications require that the gain configuration be digitally programmable, such as through the use of various programmable switches which sample a tapped, passive divider network.

For example, with reference to FIG. 2, an exemplary programmable gain amplifier 200 comprising a differential input/differential output configuration is illustrated. Programmable gain amplifier 200 comprises a first op-amp A1 and a second op-amp $A_2$ having positive input terminals IN1 and IN2 configured as a differential input port, and output terminals OUT1 and OUT2 configured as a differential output port. To provide a programmable gain function, a tapped passive divider network 202, comprising a tapped resistor, is coupled between output terminals OUT1 and OUT2 and inverting input terminals of first op-amp $A_1$ and a second op-amp $A_2$ through switch devices 204 and 206. In this example, switched devices 204 and 206 comprise MOSFET-type switches multiplexed together and configured to receive control signals, e.g., control signals A, B and C. However, tapped passive divider network 202 and switch devices 204 and 206 can comprise various configurations for facilitating programmable gain within amplifier 200. As is the case with DIDO amplifiers generally, op-amps $A_1$ and $A_2$ are typically compensated for unity-gain stability, leading to narrower than optimal differential-mode bandwidth.

Solutions exist for resolving the common-mode stability/differential mode bandwidth in some fixed gain applications. For example, in conventional fixed-gain amplifiers, such as that illustrated in FIG. 1, the implementation of a current feedback configuration for op-amps $A_1$ and $A_2$ can maintain a high bandwidth for differential mode, since the open loop gain of the op-amps increases at the same rate as the increase in the closed loop gain. This effect is due to presence of $R_0$, which serves to increase the closed-loop gain of DIDO amplifier 100, while simultaneously increasing the effective transconductance, i.e., $1/(R_1 \| R_0/2)$, of op-amps $A_1$ and $A_2$.

However, such current feedback op-amps are impractical or cannot be used with programmable gain amplifiers, such as that illustrated in FIG. 2, particularly because of the use of switch networks having a varying conductance. For example, with reference to FIG. 2, wherein $A_1$ and $A_2$ are assumed to be current-feedback op-amps, the bias current $I_B$ can be fairly large, such as 1 microamp or more. This large bias current $I_B$ flowing through switches 204 and 206 can lead to distortion, i.e., bias current $I_B$ times the varying $g_{ds}$ of switches 204 and 206 results in an error signal $V_{ERR}$ which leads to distortion.

In addition, current feedback amplifier configurations are significantly more practical for bipolar applications than for MOS applications, which are becoming increasingly prominent. For example, to improve the bandwidth during differential mode operation, an excess of transconductance is required by the current feedback op-amp. However, to achieve that high level of transconductance, significantly greater device area and current are required for the MOS devices than are required for bipolar devices, thus making the current feedback amplifier less desirable for MOS designs.

Accordingly, a need exists for technique for maintaining common mode stability in operational amplifiers, such as differential input, differential output amplifiers, without reducing differential mode bandwidth.

SUMMARY OF THE INVENTION

The method and circuit according to the present invention addresses many of the shortcomings of the prior art. In accordance with various aspects of the present invention, a Miller de-compensation technique and circuit is provided for a differential input, differential output (DIDO) amplifier that facilitates increased differential mode bandwidth while maintaining common-mode and differential mode stability for both fixed-gain and programmable gain amplifier configurations.

In accordance with an exemplary embodiment, an exemplary differential input, differential output (DIDO) amplifier comprises a pair of op-amps having a compensation capacitance circuit. The compensation capacitance circuit is configured to distinguish between differential mode signals and common mode signals, and to reduce the effects of compensation capacitance during differential mode operation, but to allow the effects of compensation capacitance to remain present during common mode operation. In accordance with an exemplary embodiment, the compensation capacitance circuit comprises at least one pair of cross-coupled compensation capacitors configured to provide de-compensation. As a result, the amount of compensation capacitance can be configured such that common mode stability can be maintained without reducing differential mode bandwidth.

In accordance with another aspect of the present invention, the amount of cancellation of the effects of compensation capacitance during differential mode operation can be suitably varied, so long as the net compensation capacitance is positive. In accordance with an exemplary embodiment, the compensation capacitance circuit comprises cross-coupled compensation capacitors that can be selectively connected through a switched network. Thus, a differential mode response approximately two, three, ten or more times faster than the common mode response could result, and yet common mode stability can remain unaffected.

In accordance with an exemplary embodiment, the DIDO amplifier can be configured for fixed-gain applications or as a programmable gain amplifier.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
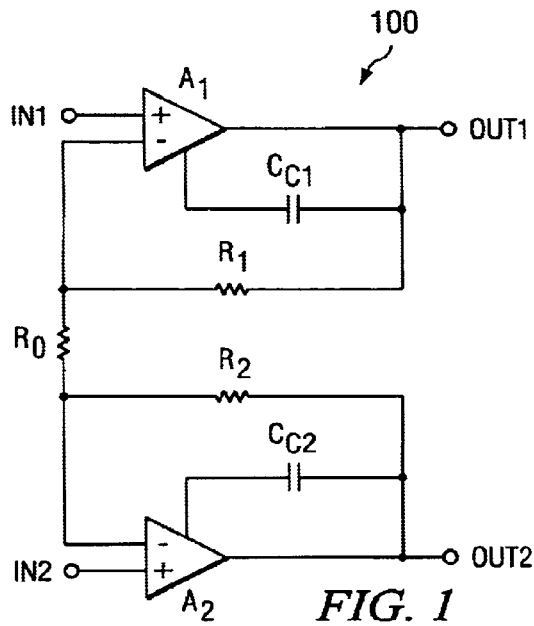
FIG. 1 illustrates a block diagram of a prior art differential input/differential output amplifier circuit configured with Miller compensation.
Figure 3:
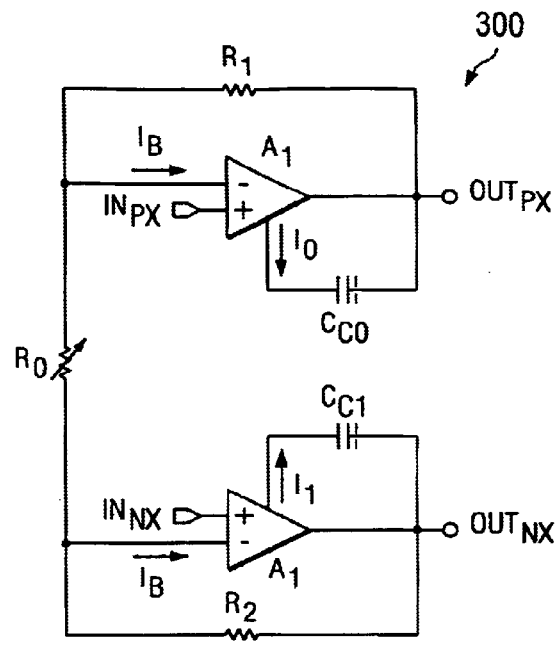
FIG. 3 illustrates a block diagram of a prior art differential input/differential output amplifier circuit configured as a resistor-programmable amplifier with Miller compensation.
Figure 2:
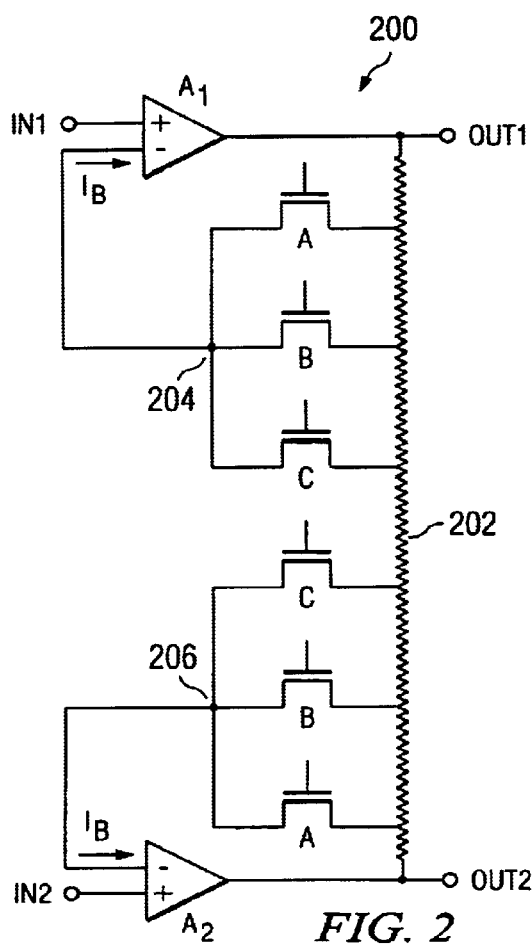
FIG. 2 illustrates a block diagram of a prior art differential input/differential output amplifier circuit configured as a digitally programmable gain amplifier.

The present invention may be described herein in terms of various functional components and various processing steps. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. Such general applications that may be appreciated by those skilled in the art in light of the present disclosure are not described in detail herein. However for purposes of illustration only, exemplary embodiments of the present invention will be described herein in connection with a differential input/differential output amplifier configured with programmable gain functions. Further, it should be noted that while various components may be suitably coupled or connected to other components within exemplary circuits, such connections and couplings can be realized by direct connection between components, or by connection through other components and devices located thereinbetween.

As discussed above, for many prior art differential input, differential output amplifiers to maintain common mode stability, the differential mode response tends to be overcompensated, resulting in reduced differential mode bandwidth. While current feedback op-amp configurations may be able to provide two desired gain bandwidths for fixed gain applications, e.g., a low bandwidth for common mode and a high bandwidth for differential mode, such current feedback op-amp configurations cannot be readily implemented within programmable gain amplifiers. In addition such current feedback op-amp configurations are not useful in MOS applications due to the device area and current requirements for the current feedback op-amp.

However, in accordance with various aspects of the present invention, a Miller de-compensation technique and circuit is provided for a differential input, differential output (DIDO) amplifier configured as a programmable gain amplifier that facilitates increased differential mode bandwidth while maintaining common-mode and differential mode stability for both fixed-gain and programmable gain amplifier configurations, as well as in MOS applications.

In accordance with an exemplary embodiment, an exemplary differential input, differential output (DIDO) amplifier comprises a pair of op-amps having a compensation capacitance circuit configured for providing compensation to the pair of op-amps. The compensation capacitance circuit is configured to distinguish between differential mode signals and common mode signals provided to the pair of op-amps, and to reduce the effects of compensation capacitance during differential mode operation, but to allow the effects of compensation capacitance to remain present during common mode operation. In accordance with an exemplary embodiment, the compensation capacitance circuit comprises at least one pair of cross-coupled compensation capacitors. As a result, the amount of compensation capacitance can be configured such that common mode stability can be maintained without reducing differential mode bandwidth.

Figure 4:
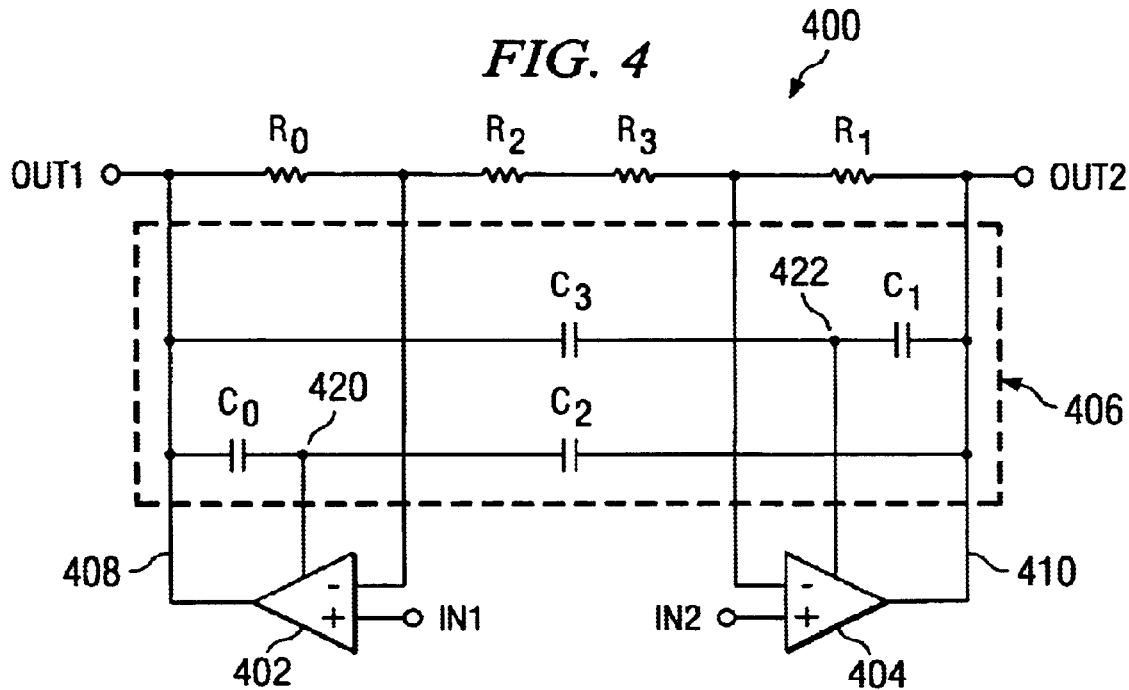
FIG. 4 illustrates a block diagram of an exemplary differential input/differential output amplifier circuit in accordance with an exemplary embodiment of the present invention.

With reference to FIG. 4, an exemplary differential input, differential output (DIDO) amplifier 400 is illustrated in accordance with an exemplary embodiment of the present invention. DIDO amplifier 400 is suitably configured for receiving a differential input signal at a pair of input terminals IN1 and IN2, and for providing a differential output at a pair of output terminals OUT1 and OUT2. DIDO amplifier 400 can be configured in various arrangement, including as a fixed-gain or programmable-gain amplifier.

In accordance with the exemplary embodiment, DIDO amplifier 400 comprises a pair of op-amps 402 and 404 having a compensation capacitance circuit 406 configured for providing compensation to op-amps 402 and 404, i.e., op-amps 402 and 404 are externally compensated. Op-amps 402 and 404 are suitably configured to provide a differential input, differential output operation. Op-amps 402 and 404 can comprise various transconductance or other amplifier stages and configurations. Op-amp 402 includes a non-inverting input terminal configured as input terminal IN1, and an output terminal 408 coupled to output terminal OUT1. In addition, op-amp 402 includes a feedback resistor $R_0$ coupled between the output terminal of op-amp 402 and the inverting terminal of op-amp 402. Op-amp 404 includes a non-inverting input terminal configured as input terminal IN2, and an output terminal 410 coupled to output terminal OUT1. In addition, a feedback resistor $R_1$ is coupled between the output of op-amp 404 and the inverting input terminal of op-amp 404.

Feedback resistors $R_0$ and $R_1$ can be suitably configured in various manners to provide a gain function. To generate a gain function during differential mode, a spanning resistor $R_2$ can be coupled to the inverting input terminal of op-amp 402, while a spanning resistor $R_3$ is coupled to the inverting input terminal of op-amp 404. To provide a fixed gain application, feedback resistors $R_0$ and $R_1$ have fixed-value resistances. To provide a programmable gain function, feedback resistors $R_0$ and $R_1$ can comprise variable resistor devices. As will be discussed in more detail below, in accordance with an exemplary embodiment in which feedback resistors $R_0$ and $R_1$ are equal and spanning resistors $R_2$ and $R_3$ are equal, a closed loop, differential mode gain can be realized for op amp 402 of $1+R_0/R_2$, and a closed loop, differential mode gain can be realized for op amp 404 of $1+R_1/R_3$. Meanwhile, the common mode gain comprises unity gain, e.g., 1V/V, since spanning resistors carry no current in a common mode half circuit.

Compensation capacitance circuit 406 is configured to distinguish between differential mode signals and common mode signals provided to op-amps 402 and 404, i.e., signals applied to input terminals IN1 and IN2. In addition, compensation capacitance circuit 406 is configured to reduce the effects of compensation capacitance during differential mode operation, but to allow the effects of compensation capacitance to remain present during common mode operation.

In accordance with an exemplary embodiment, compensation capacitance circuit 406 comprises a cross-coupling arrangement to facilitate a reduction of effective compensation capacitance during differential mode operation. In accordance with this embodiment, a Miller compensation capacitor $C_0$ is coupled from within op-amp 402 to output terminal 408, i.e., output terminal OUT1, and a Miller compensation capacitor $C_1$ is coupled from within op-amp 404 to output terminal 410, i.e., output terminal OUT2. In addition, a Miller compensation capacitor $C_2$ is cross-coupled from within op-amp 402 to output terminal OUT2, and a Miller compensation capacitor $C_3$ is cross-coupled from within op-amp 404 to output terminal OUT1.

As a result of this cross-coupling arrangement of compensation capacitors $C_2$ and $C_3$, the amount of compensation capacitance can be configured based on whether DIDO amplifier 400 is operating in common mode or differential mode such that common mode stability can be maintained without reducing differential mode bandwidth. For example, during operation with a common mode signal applied to input terminals IN1 and IN2, compensation capacitors $C_0$ and $C_2$ will suitably be added to provide a total capacitance of $C_0+C_2$ for op-amp 402, while compensation capacitors $C_1$ and $C_3$ will suitably be added to provide a total capacitance of $C_1+C_3$ for op-amp 404. The total capacitances of $C_0+C_2$ and $C_1+C_3$ are suitably configured to facilitate stability during common mode as if op-amps 402 and 404 are operating as unity gain amplifiers. As a result, common mode stability can be suitably maintained.

However, when a differential mode signal is applied to input terminals IN1 and IN2, e.g., a positive signal to IN1 and a negative signal to IN2, compensation capacitor $C_2$ will behave as a negative capacitance such that compensation capacitors $C_0$ and $C_2$ will suitably be subtracted to provide a total capacitance of $C_0$–$C_2$ for op-amp 402, while compensation capacitor $C_3$ will behave as a negative capacitance such that compensation capacitors $C_1$ and $C_3$ will suitably be subtracted to provide a total capacitance of $C_1$–$C_3$ for op-amp 404. Thus, for compensation capacitors $C_0$ and $C_1$ having a slightly larger capacitance value than compensation capacitors $C_2$ and $C_3$, the differences in capacitance will be small, resulting in minimal total capacitance during differential mode operation. Thus, the total capacitances of $C_0+C_2$ and $C_1+C_3$ can suitably configured to facilitate stability during common mode operation without being overcompensated such that differential mode gain bandwidth is significantly reduced.

Figure 6:
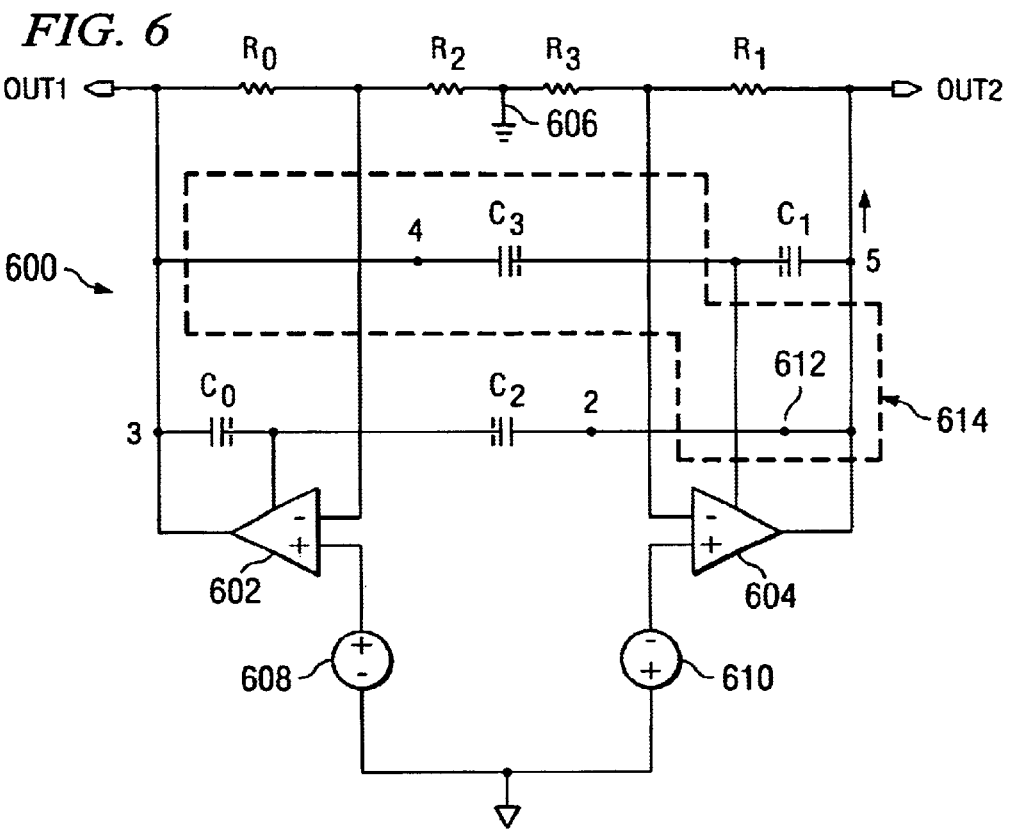
FIG. 6 illustrates a schematic diagram of an exemplary embodiment of a differential input/differential output amplifier circuit configured for differential mode operation in accordance with the present invention.
Figure 7:
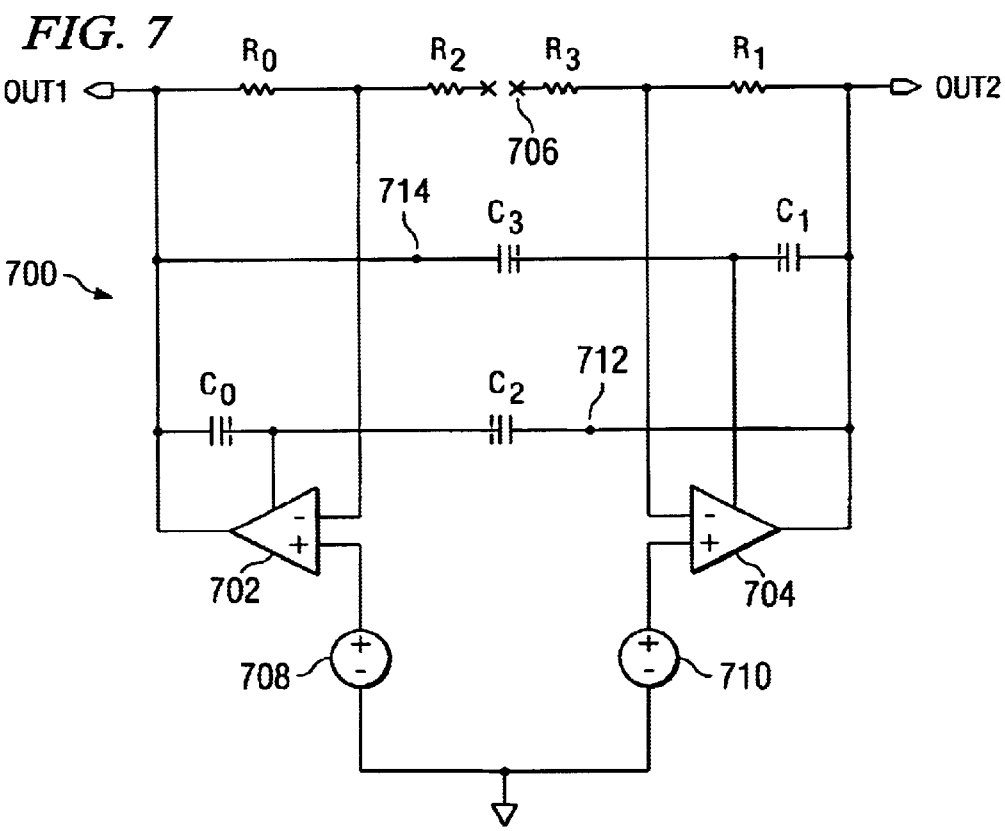
FIG. 7 illustrates a schematic diagram of an exemplary embodiment of a differential input/differential output amplifier circuit configured for common mode operation in accordance with the present invention.

With reference to FIGS. 6 and 7, illustrations of DIDO amplifier 400 configured for differential mode operation 600 and common mode operation 700 are provided. DIDO amplifiers 600 and 700 suitably comprise op-amps 602, 604 and 702, 704 configured to provide a differential input, differential output operation. For differential mode operation, a differential mode signal can be provided by a positive supply 608 and a negative supply 610, with op-amp 602 including a non-inverting input terminal coupled to positive supply 608, and op amp 604 including a non-inverting input terminal coupled to negative supply 610. However, the polarity of the differential mode signal provided by positive supply 608 and negative supply 610 could also be suitably coupled in reverse for the non-inverting input terminals of op-amps 602 and 604. For common mode operation, a common mode signal can be provided by a positive supply 708 and a positive supply 710, with op-amp 702 including a non-inverting input terminal coupled to positive supply 708, and op-amp 704 including a non-inverting input terminal coupled to positive supply 710.

In accordance with an exemplary embodiment, feedback resistors $R_0$ and $R_1$ comprise approximately 6 k ohm resistance values, while spanning resistors $R_2$ and $R_3$ comprise approximately 60 ohm resistance values. During differential mode operation, DIDO amplifier 600 will behave as if a ground terminal 606 is configured between spanning resistors $R_2$ and $R_3$. Thus, the closed loop, differential mode gain is $1+R_0/R_2$, or approximately 100 V/V for op-amp 602, while the closed loop, differential mode gain is $1+R_1/R_3$, or approximately 100 V/V for op-amp 604. However, for a common mode half-circuit, DIDO amplifier 700 will behave as if an open circuit 706 is configured between spanning resistors $R_2$ and $R_3$. Since spanning resistors $R_2$ and $R_3$ carry no current in the common mode half-circuit, the common mode gain is unity gain of 1 V/V.

When a common mode signal is applied to DIDO amplifier 700, op-amps 702 and 704 do not recognize that cross coupling of compensation capacitors $C_2$ and $C_3$ is present, since positive supply 708 and positive supply 710 are moving in phase. In other words, in common mode the non-inverting inputs of op-amps 602 and 604 are identical in voltage to each other, and similarly output terminals OUT1 and OUT2 are identical in voltage to each other. As a result, output terminal OUT2 may be swapped for output terminal OUT1 at a terminal 712 of compensation capacitor $C_2$ without any effect on common-mode stability. Likewise, output terminal OUT1 may be swapped for output terminal OUT2 at a terminal 714 of compensation capacitor $C_3$ without any effect on common-mode stability.

However, when a differential mode signal is applied to DIDO amplifier 600, a positive feedback loop 614 is created. For example, with reference to FIG. 6, to analyze the loop gain starting at a node 1 by inserting an open circuit at a node 612, as node 1 increases, node 2 will increase. However, node 3 will decrease due to an inverting stage, and thus node 4 decreases. Finally, node 5 will increase due to another inverting stage. Thus, for a positive feedback loop 614, the feedback loop will only be stable if the loop gain is less than one. Thus, for Miller compensation capacitors $C_0$, $C_1$, $C_2$ and $C_3$ to provide stability, compensation capacitor $C_0$ should have a capacitance greater than the capacitance of compensation capacitor $C_2$, and compensation capacitor $C_1$ should have a capacitance greater than the capacitance of compensation capacitor $C_3$.

Accordingly, through the cross coupling arrangement, Miller compensation capacitors $C_0$ and $C_2$ add for common mode signals, and subtract for differential mode signals, while Miller compensation capacitors $C_1$ and $C_3$ add for common mode signals, and subtract for differential mode signals. For example, in accordance with an exemplary embodiment, Miller compensation capacitors $C_0$ and $C_1$ can comprise 30 pF capacitors, and Miller compensation capacitors $C_2$ and $C_3$ can comprise 25 pF capacitors. As a result, common mode compensation comprises 30+25=55 pF which can provide for unity gain stability, while differential mode compensation utilizes only 30−25=5 pF. Accordingly, the differential mode response can be approximately 11 times faster than the common-mode response.

Figure 5:
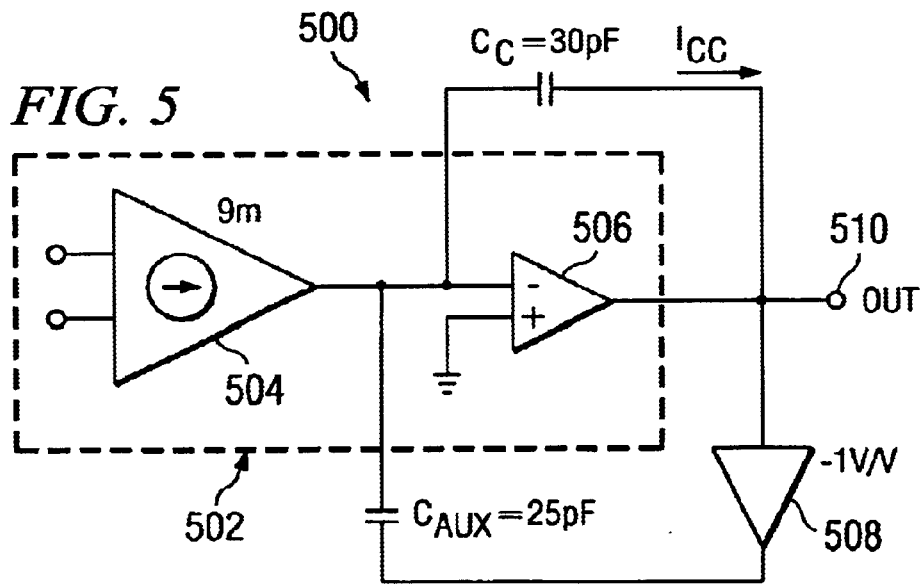
FIG. 5 illustrates a block diagram of a representation of an exemplary differential input/differential output amplifier circuit in accordance with an exemplary embodiment of the present invention.

To facilitate a further understanding of the manner that a DIDO amplifier 400 and compensation capacitance circuit 406 can operate to effectively cancel compensation capacitance during differential mode operation in DIDO amplifier 600, with additional reference to FIG. 5, an illustration of an exemplary op-amp circuit 500 having an op-amp 502 representative of op-amps 402 and 404 can be provided. Op amp 502 includes a transconductance stage 504 and an amplifier stage 506 having an output terminal 510. A Miller compensation capacitor $C_C$ having a capacitance of 30 pF is coupled within op-amp 502, e.g., between transconductance stage 504 and a negative input terminal of op amp 506, and output terminal 510. In addition, a positive feedback signal can be provided through an auxiliary capacitor $C_{AUX}$ having a capacitance of 25 pF and an amplifier stage 508 having a gain of −1 V/V. Due to the negative gain of amplifier stage 508 during operation, when a positive signal is applied through transconductance stage 504 to amplifier 506, the 25 pF of capacitance of auxiliary capacitor $C_{AUX}$ is effectively canceled from the effect of the 30 pF of capacitance of compensation capacitor $C_C$, resulting in 5 pF of capacitance during operation, e.g., during differential mode operation of DIDO amplifier 400. Such a circuit 500 is representative of the operation of DIDO amplifier 600 during differential mode, in which in effect comprises less that half of the unity gain compensation capacitance being cross-coupled to provide a net compensation capacitance that is significantly reduced, and yet is still positive for stability during differential mode.

In addition, the amount of cancellation of the effects of compensation capacitance during differential mode operation can be suitably varied, so long as the net compensation capacitance is positive. For example, compensation capacitors $C_0$ and $C_1$ may comprise 35 pf or 40 pF capacitors, while compensation capacitors $C_2$ and $C_3$ may comprise 20 pF or 15 pF capacitors, for a net compensation capacitance of 15 pF or 25 pF. Thus, a differential mode response approximately three or two times faster than the common mode response could result, and yet common mode stability would be unaffected.

Accordingly, compensation capacitance circuit 406 can be suitably configured in any manner such that the total capacitance of compensation capacitors $C_0$ and $C_2$ and compensation capacitors $C_1$ and $C_3$ provide unity gain stability during common mode operation, and such that the net compensation capacitance provided from cross-coupling of compensation capacitors $C_2$ and $C_3$ during differential mode operation is positive to provide differential mode stability, i.e., compensation capacitor $C_0$ has a capacitance greater than the capacitance of compensation capacitor $C_2$, and compensation capacitor $C_1$ has a capacitance greater than the capacitance of compensation capacitor $C_3$ to prevent a negative Miller compensation capacitance.

Thus, as a result, compensation capacitance circuit 406 is configured to suitably distinguish between common-mode operation and differential mode operation by configuring the closed-loop gain environment of DIDO amplifier 400. In accordance with an exemplary embodiment, compensation capacitors and can be suitably cross-coupled in a fixed manner to op-amps 404 and 402, respectively, such that common-mode signals and differential mode signals suitably operate within DIDO amplifier 400 without explicit steering or coupling to provide effective compensation during common-mode operation, and effective de-compensation during differential mode operation. However, in accordance with another exemplary embodiment, during initial operation, DIDO amplifier 400 can operate at low differential mode gains with all compensation "local" to the op-amp, where local denotes that both terminals of compensation capacitors $C_0$ and $C_2$ are connected to op-amp 402, i.e., to the compensation node of op-amp 402 and to output terminal $OUT_1$, and both terminals of compensation capacitors $C_1$ and $C_3$ are connected to op-amp 404, i.e., to the compensation node of op-amp 404 and to output terminal $OUT_2$. As the differential mode gain is increased, compensation capacitors $C_2$ and $C_3$ can be suitably cross-coupled to the complementary op-amp, i.e., compensation capacitors $C_2$ cross-coupled to op-amp 404 and compensation capacitors $C_3$ cross-coupled to op-amp 402, based on a desired closed-loop gain.

Thus, while the above exemplary embodiment of DIDO amplifier 400 appears to include a compensation capacitance circuit 406 having compensation capacitors $C_2$ and $C_3$ fixed in a cross-coupled arrangement, i.e., compensation capacitor $C_2$ is connected directly between a compensation node 420 of op-amp 402 and output terminal OUT2, and compensation capacitor $C_3$ is connected directly between a compensation node 422 of op-amp 404 and output terminal OUT1, compensation circuit 406 can also be configured with a switched network configured to selectively cross-couple compensation capacitors $C_2$ and $C_3$, or additional pairs of compensation capacitors, between the compensation nodes of op-amp 402 and 404 or output terminals OUT1 and OUT2.

Figure 8:
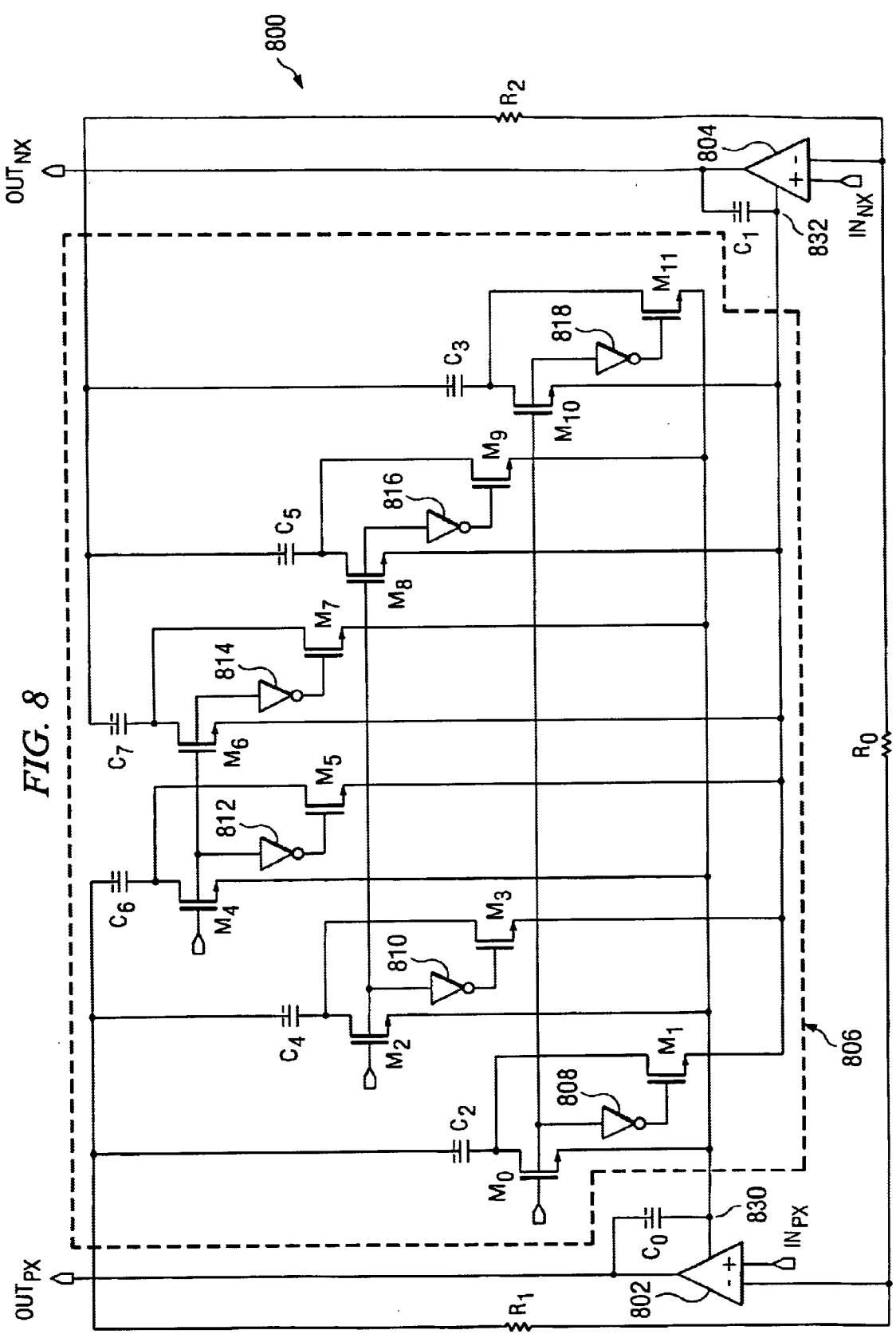
FIG. 8 illustrates a schematic diagram of an exemplary embodiment of a differential input/differential output amplifier circuit configured with a switched compensation capacitor network in accordance with the present invention.

For example, in accordance with an exemplary embodiment, with reference to FIG. 8, a DIDO amplifier 800 is suitably configured for receiving a differential input signal at a pair of input terminals $IN_{PX}$ and $IN_{NX}$, and for providing a differential output at a pair of output terminals $OUT_{PX}$ and $OUT_{NX}$. DIDO amplifier 800 can be configured in various arrangement, including as a fixed-gain or programmable-gain amplifier.

In accordance with the exemplary embodiment, DIDO amplifier 800 comprises a pair of op-amps 802 and 804 having a compensation capacitance circuit 806 configured for providing compensation to op-amps 802 and 804, i.e., op-amps 802 and 804 are externally compensated. Op amp 802 includes a feedback resistor $R_1$ coupled between output terminal $OUT_{PX}$ and an inverting input terminal of op-amp 802. Op-amp 804 includes a feedback resistor $R_2$ coupled between output terminal $OUT_{NX}$ and an inverting input terminal of op-amp 804. In addition, a spanning resistor $R_0$ is coupled to the inverting input terminals of op-amps 802 and 804. To provide a fixed gain application, feedback resistors $R_0$, $R_1$ and $R_2$ have fixed-value resistances. To provide a programmable gain function, feedback resistors $R_0$, $R_1$ and $R_2$ have can comprise variable resistor devices, and can be configured for digital control, such as through switching devices and the like.

Compensation capacitance circuit 806 suitably comprises a plurality of compensation capacitors $C_0$–$C_7$ configured to provide compensation to op-amps 802 and 804. Compensation capacitors $C_0$–$C_7$ are configured to provide the compensation required to provide stability during common-mode operation. Compensation capacitor $C_0$ is connected between the compensation node 830 of op-amp 802 and output terminal $OUT_{PX}$, while compensation capacitor $C_1$ is connected between the compensation node 832 of op-amp 804 and output terminal $OUT_{NX}$. Compensation capacitance circuit 806 is configured to distinguish between differential mode signals and common mode signals applied to input terminals $IN_{PX}$ and $IN_{NX}$, and to selectively couple compensation capacitors $C_2$–$C_7$ to compensation nodes of op-amps 802 and 804 and output terminals $OUT_{PX}$ and $OUT_{NX}$ to reduce the effects of the compensation capacitance during differential mode operation, but to allow the effects of compensation capacitance to remain present during common mode operation.

In accordance with an exemplary embodiment, compensation capacitance circuit 806 comprises a switched capacitor arrangement comprising compensation capacitors $C_2$–$C_7$, transistors $M_0$–$M_{11}$, and inverters 808, 810, 812, 814, 816 and 818. For control of compensation capacitance circuit 806, control signals $COMP_1$, $COMP_2$, and $COMP_3$ are suitably configured to drive the gates of transistors $M_0$–$M_{11}$. In accordance with this exemplary embodiment, compensation capacitors $C_2$, $C_4$, and $C_6$ and compensation capacitors $C_3$, $C_5$, and $C_7$ are suitably connected directly to output terminals $OUT_{PX}$ and $OUT_{NX}$, respectively. In addition, compensation capacitors $C_2$, $C_4$, and $C_6$ can be selectively coupled through transistors $M_0$–$M_5$ and inverters 808, 810 and 812 to the compensation nodes 830, 832 of op-amps 802 and 804, while compensation capacitors $C_3$, $C_5$, and $C_7$ can be selectively coupled through transistors $M_6$–$M_{11}$, and inverters 814, 816 and 818 to the compensation nodes 830,832 of op-amps 802 and 804.

For example, when control signal $COMP_1$ is in a high condition, transistor $M_0$ will be turned on to suitably couple compensation capacitor $C_2$ to the compensation node of op-amp 802, while transistor $M_{10}$ will be turned on to suitably couple compensation capacitor $C_3$ to the compensation node 832 of op-amp 804. Likewise, when control signal $COMP_2$ is in a high condition, transistor $M_2$ will be turned on to suitably couple compensation capacitor $C_4$ to the compensation node 830 of op-amp 802, while transistor $M_8$ will be turned on to suitably couple compensation capacitor $C_5$ to the compensation node 832 of op-amp 804. Further, when control signal $COMP_3$ is in a high condition, e.g., during common-mode operation, transistor $M_4$ will be turned on to suitably couple compensation capacitor $C_6$ to the compensation node 830 of op-amp 802, while transistor $M_6$ will be turned on to suitably couple compensation capacitor $C_7$ to the compensation node 832 of op-amp 804. Accordingly, compensation capacitance circuit 806 can suitably facilitate compensation during common-mode operation.

On the other hand, when control signal $COMP_1$ is in a low condition, transistor $M_1$ will be turned on through operation of inverter 808 to suitably cross-couple compensation capacitor $C_2$ to the compensation node 832 of op-amp 804, while transistor $M_{11}$ will be turned on through operation of inverter 818 to suitably cross-couple compensation capacitor $C_3$ to the compensation node 830 of op-amp 802. Likewise, when control signal $COMP_2$ is in a low condition, transistor $M_3$ will be turned on through inverter 810 to suitably cross-couple compensation capacitor $C_4$ to the compensation node 832 of op-amp 804, while transistor $M_9$ will be turned on through operation of inverter 816 to suitably cross-couple compensation capacitor $C_5$ to the compensation node 830 of op-amp 802. Further, when control signal $COMP_3$ is in a low condition, transistor $M_5$ will be turned on through operation of inverter 812 to suitably cross-couple compensation capacitor $C_6$ to the compensation node 832 of op-amp 804, while transistor $M_7$ will be turned on through inverter 814 to suitably cross-couple compensation capacitor $C_7$ to the compensation node of op-amp 802. Accordingly, compensation capacitance circuit 806 can facilitate selective de-compensation of DIDO amplifier 800 during differential mode operation, i.e., vary the amounts of de-compensation.

Figure 9:
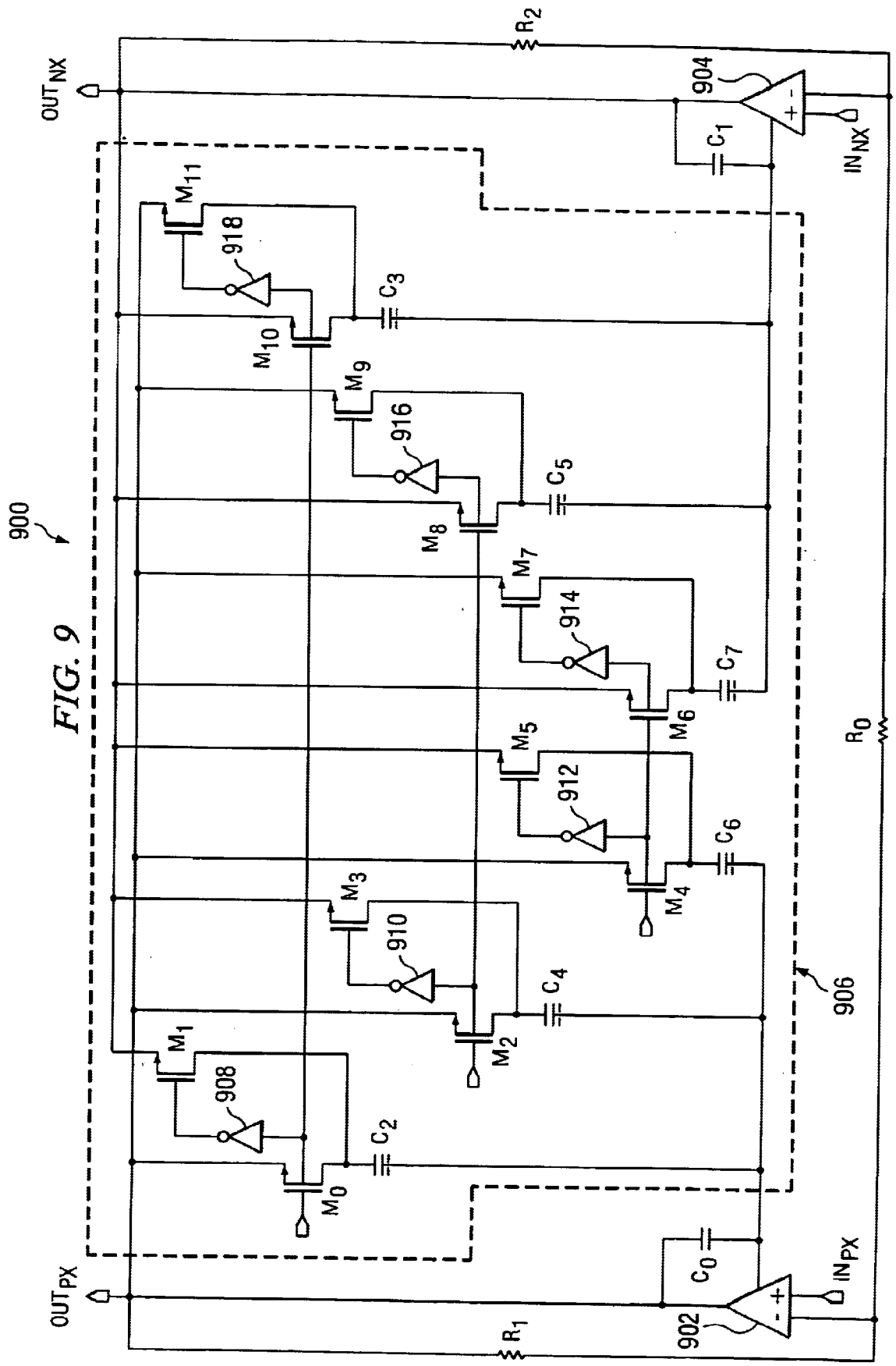
FIG. 9 illustrates a schematic diagram of another exemplary embodiment of a differential input/differential output amplifier circuit configured with a switched compensation capacitor network in accordance with the present invention.

While compensation capacitance circuit 806 is suitably configured to selectively couple compensation capacitors $C_2$, $C_4$, and $C_6$ and compensation capacitors $C_3$, $C_5$, and $C_7$ to the compensation nodes 830, 832 of op-amps 802 and 804, a compensation capacitance circuit can also be configured to selectively connect compensation capacitors $C_2$, $C_4$, and $C_6$ and compensation capacitors $C_3$, $C_5$, and $C_7$ to output terminals $OUT_{PX}$ and $OUT_{NX}$. For example, with reference to FIG. 9, a compensation capacitance circuit 906 is configured with compensation capacitors $C_2$, $C_4$, and $C_6$ and compensation capacitors $C_3$, $C_5$, and $C_7$ directly connected to op-amps 902 and 904, respectively. In addition, compensation circuit 906 is suitably configured to selectively connect compensation capacitors $C_2$, $C_4$, and $C_6$ through transistors $M_0$–$M_5$ and inverters 908, 910 and 912 to output terminals $OUT_{PX}$ and $OUT_{NX}$, and compensation capacitors $C_3$, $C_5$, and $C_7$ through transistors $M_6$–$M_{11}$ and inverters 914, 916 and 918 to output terminals $OUT_{PX}$ and $OUT_{NX}$.

In addition, while compensation capacitance circuit 806 suitably comprises three pairs of compensation capacitors $C_2$–$C_7$ selectively cross-coupled to op amps 802 and 804, fewer or additional compensation capacitors can be included within various other exemplary embodiments. For example, a single pair of compensation capacitors $C_2$ and $C_3$, such as that illustrated in DIDO amplifier 400, can be included, or a plurality of four, five or six pairs or more of compensation capacitors can be suitably included. Further, corresponding transistors or other switches can be suitably provided to facilitate the cross-coupling of the plurality of compensation capacitors during common mode or differential mode operation. Moreover, although a single inverter is illustrated connected between the control signal and the gate of one transistor for each compensation capacitor, e.g., an inverter 808 connected between control signal $COMP_1$ and the gate of transistor M1, any other logic configurations can be provided for facilitating the cross-coupling of the plurality of compensation capacitors during common mode or differential mode operation.

Further, in accordance with another aspect of the present invention, the amount of cancellation of the effects of compensation capacitance, i.e., the amount of de-compensation, during differential mode operation can be suitably varied, so long as the net compensation capacitance is positive, i.e., in the above example, the capacitance of compensation capacitor $C_0$ and the capacitance of compensation capacitor $C_1$ must be greater than the total capacitance of compensation capacitors $C_2$, $C_4$ and $C_6$ and the total capacitance of compensation capacitors $C_3$, $C_5$ and $C_7$. For example, control signals $COMP_1$, $COMP_2$, and $COMP_3$ can be suitably configured to operate alone, or in various combinations, to provide various levels of de-compensation during differential mode operation, e.g., control signals $COMP_1$ and $COMP_2$ could provide a high signal to provide local coupling of compensation capacitors $C_2$ and $C_4$ to op-amp 802, while control signal $COMP_3$ could provide a low signal to provide cross-coupling of compensation capacitor $C_6$ to op-amp 804.

In addition, compensation capacitors $C_2$–$C_7$ can comprise the same capacitance value, e.g., 1–100 pF, or can be scaled or weighted in capacitance value, e.g., binary weighted having compensation capacitors $C_2$ and $C_3$ with a capacitance value of 1 pF, compensation capacitors $C_4$ and $C_5$ with a capacitance value of 2 pF, and compensation capacitors $C_6$ and $C_7$ with a capacitance value of 4 pF. Accordingly, compensation capacitance circuit 806 can be configured to provide de-compensation through selective operation of the control signals and/or suitable scaling or weighting of the compensation capacitors.

Figure 10:
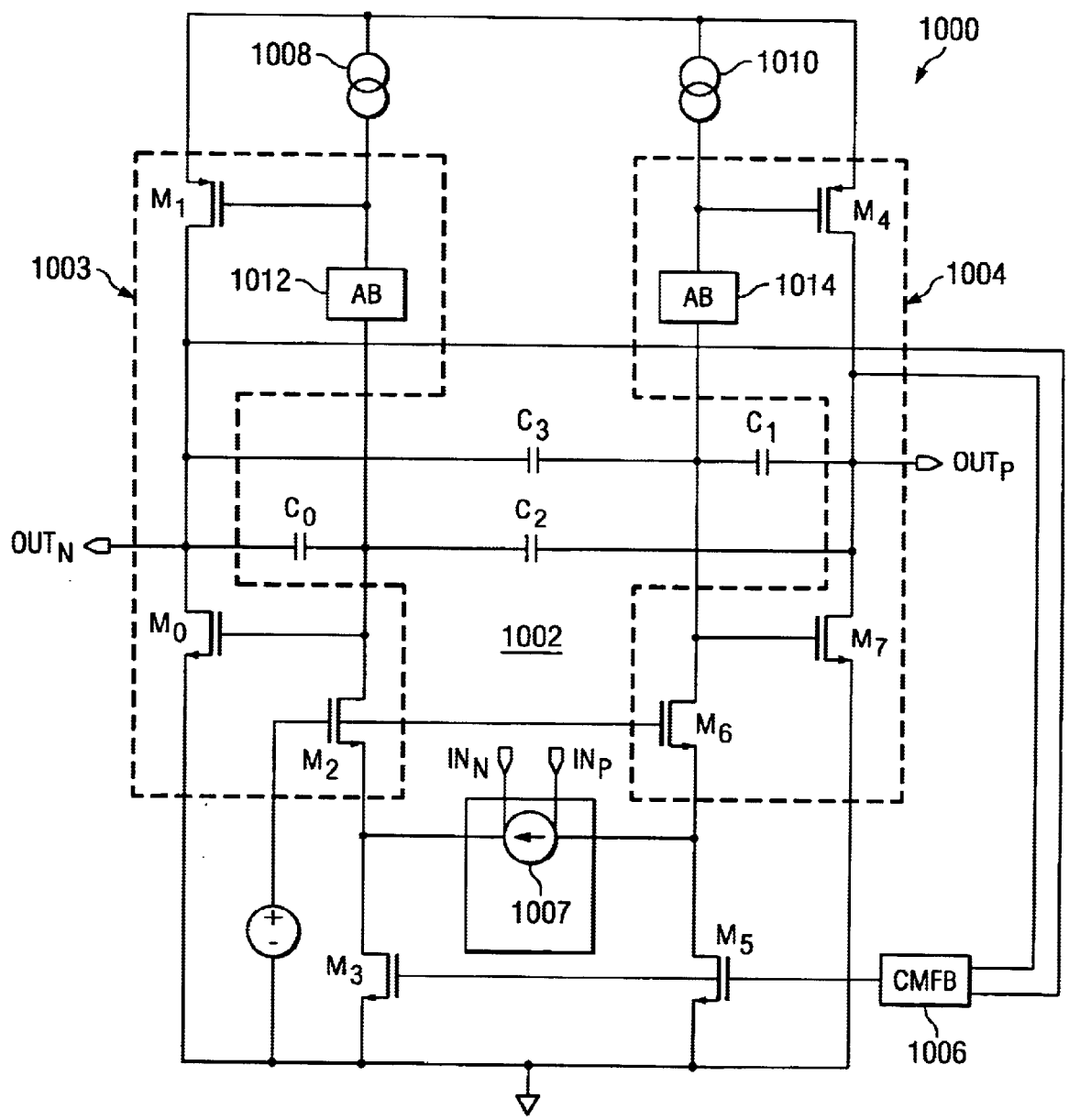
FIG. 10 illustrates a schematic diagram of an exemplary embodiment of a differential input/differential output op-amp circuit in accordance with the present invention.

In accordance with another exemplary embodiment, with reference to FIG. 10, an exemplary DIDO op-amp having a compensation capacitance circuit can be configured within an op-amp circuit 1000. For example, op-amp circuit 1000 can include a DIDO amplifier 1002 comprising a first op-amp 1003 including transistors $M_0$, $M_1$, and $M_2$ and a Class A-B control 1012, a second op-amp 1004 including transistors $M_4$, $M_6$, and $M_7$ and a Class A-B control 1014, and a common input transconductance 1007. In addition, DIDO amplifier 1002 comprises compensation capacitors $C_0$ and $C_1$ coupled between output terminals $OUT_N$ and $OUT_P$ and the compensation nodes of op amps 1003 and 1004, i.e., the drains of transistors $M_2$ and $M_6$, and compensation capacitors $C_2$ and $C_3$ coupled to the compensation nodes and configured for cross-coupling to output terminals $OUT_N$ and $OUT_P$. Compensation capacitors $C_2$ and $C_3$ can be cross-coupled in a fixed manner, or through a switched-capacitance network. In accordance with this exemplary embodiment, DIDO amplifier 1002 is configured within a common-mode feedback loop 1006 to operational amplifier circuit 1000, which can further comprise transistors $M_3$ and $M_5$. Common-mode feedback loop 1006 is suitably configured to separate the effects of cross-coupling of compensation capacitors $C_2$ and $C_3$ during common-mode operation and differential mode operation.

Figure 11:
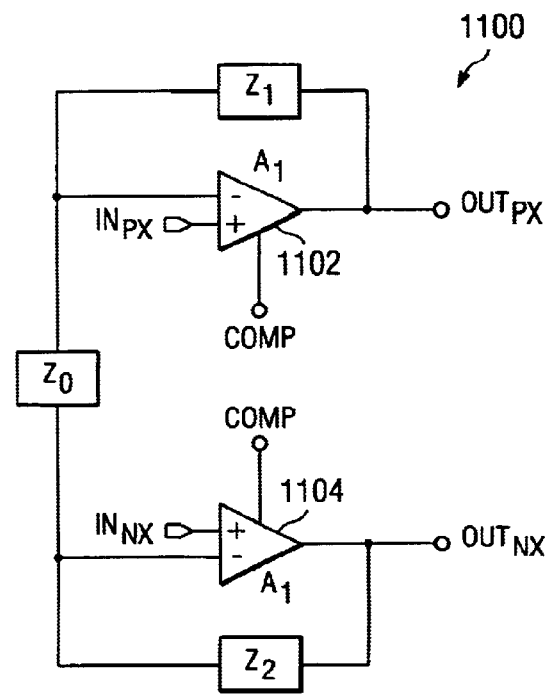
FIG. 11 illustrates another block diagram of an exemplary differential input/differential output amplifier circuit in accordance with an exemplary embodiment of the present invention.

Accordingly, an exemplary DIDO amplifier having a compensation capacitance circuit configured for de-compensation during differential mode operation can be suitably configured in various arrangements, and within any feedback network configuration. For example, with reference to FIG. 11, an exemplary compensation capacitance circuit can be configured within a DIDO amplifier 1100 having impedance devices $Z_0$, $Z_1$ and $Z_2$ configured within a feedback network of DIDO amplifier 1100. Impedance devices $Z_0$, $Z_1$ and $Z_2$ can comprise of any number of resistors, capacitors, and/or inductors configured in any combination and arrangement for providing a feedback network to DIDO amplifier 1100.

Figure 12:
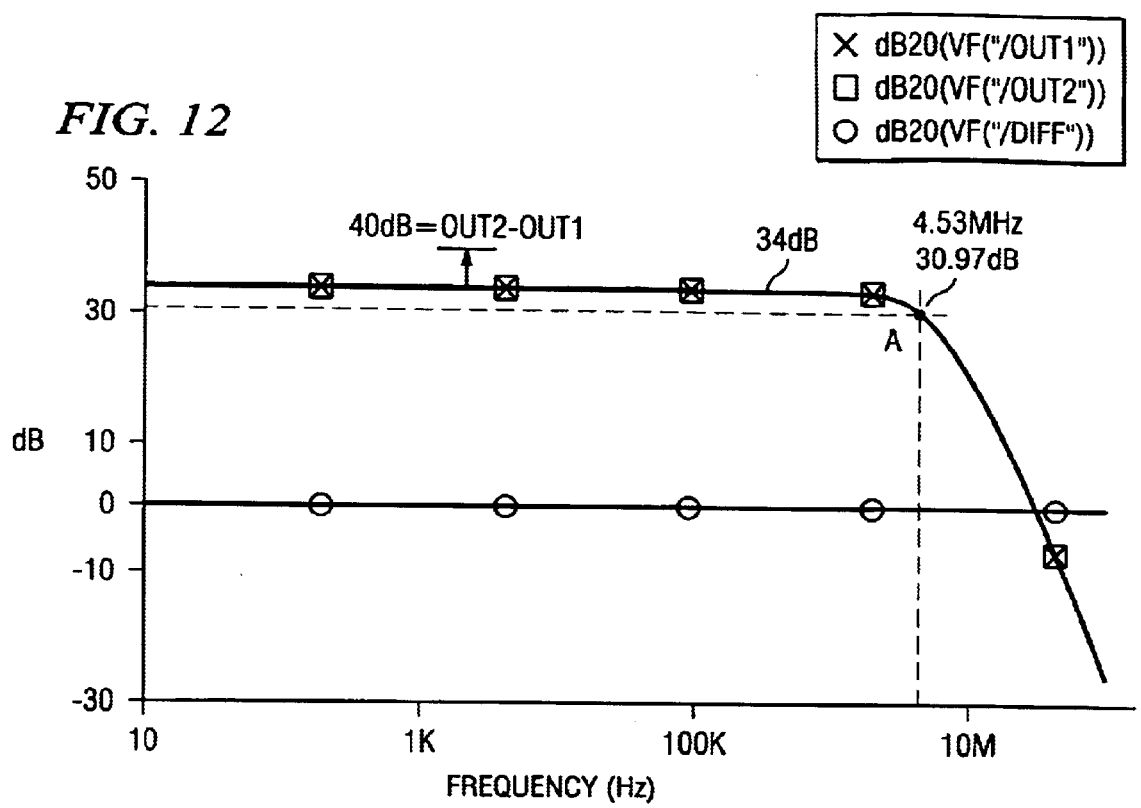
FIG. 12 illustrates a diagram of an AC response of an exemplary embodiment of a differential input/differential output amplifier configured for differential mode operation in accordance with the present invention.
Figure 13:
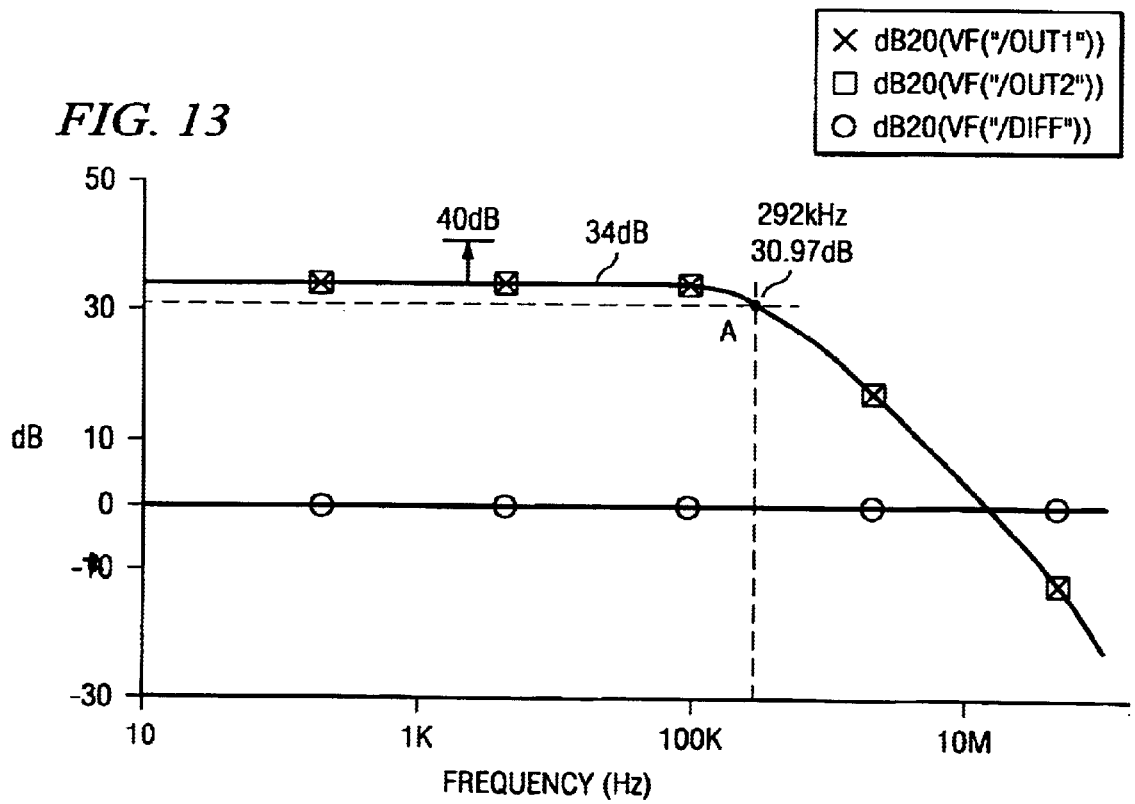
FIG. 13 illustrates a diagram of an AC response of a prior art a differential input/differential output amplifier configured for differential mode operation.

Having provided an illustration of various exemplary embodiments of a DIDO amplifiers, an example of the AC responses for an exemplary DIDO amplifier and for a prior art DIDO amplifier as illustrated with reference to FIGS. 12 and 13. For example, with reference to FIG. 12 which illustrates the AC response of a cross-coupled DIDO amplifier operating in differential mode, the AC response/frequency domain view includes a frequency A of 4.53 MHz, and thus with a differential mode gain of 100V/V, the gain bandwidth product $G_{BWdiff}$ is 453 MHz. With reference to FIG. 13 which illustrates the AC response of a locally compensated DIDO amplifier operating in differential mode, the AC response/frequency domain view includes a frequency A of 292 kHz, and thus with a differential mode gain of 100 V/V, the gain bandwidth product $G_{BWdiff}$ is 29.2 MHz, which is approximately 15 times less the gain bandwidth product of that of FIG. 8.

However, with respect to common mode operation, for the transient response of a cross-coupled DIDO amplifier operating in common mode, the transient response is settled very quickly, and is practically indistinguishable from the transient response of a locally compensated DIDO amplifier operating in common mode. Accordingly, an exemplary DIDO amplifier of the present invention can facilitate increase bandwidth during differential mode through the de-compensation techniques described above, and yet maintain common mode and differential mode stability.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing BJT or FET devices for the various components and devices. Further, the various exemplary embodiments can be implemented with other types of operational amplifier circuits in addition to the circuits illustrated above. These alternatives can be suitably selected depending upon the particular application or in consideration of any number of factors associated with the operation of the operational amplifier. Moreover, these and other changes or modifications are intended to be included within the scope of the present invention, as expressed in the following claims.

What is claimed is:

1. A differential input, differential output amplifier configured for use in an amplifier circuit, said differential input, differential output amplifier comprising:
    a first op-amp having a first compensation node and configured for providing a first input terminal and a first output terminal;
    a second op-amp having a second compensation node and configured for providing a second input terminal and a second output terminal; and
    a compensation circuit comprising a first pair of compensation capacitors and a second pair of compensation capacitors, said first pair of compensation capacitors comprising a first compensation capacitor coupled to said first compensation node and said first output terminal and a second compensation capacitor coupled to said second compensation node and said second output terminal, said second pair of compensation capacitors comprising a third compensation capacitor cross-coupled to said first compensation node and said second output terminal and a fourth compensation capacitor cross-coupled to said second compensation node and said first output terminal such that differential mode gain bandwidth can be increased while maintaining common mode stability.

2. The differential input, differential output amplifier according to claim 1, wherein said second pair of compensation capacitors are cross-coupled in a fixed manner.

3. The differential input, differential output amplifier according to claim 1, wherein said second pair of compensation capacitors are selectively cross-coupled.

4. The differential input, differential output amplifier according to claim 1, wherein said differential input, differential output amplifier further comprises a first feedback resistor coupled between an inverting input terminal of said first op-amp and said first output terminal, and a second feedback resistor coupled between an inverting input terminal of said second op-amp and said second output terminal, and at least one additional resistor coupled between said inverting input terminal of said first op-amp and said inverting input terminal of said second op-amp.

5. The differential input, differential output amplifier according to claim 4, wherein said first feedback resistor, said second feedback resistor, and said at least one additional resistor are configured to provide a fixed-gain configuration.

6. The differential input, differential output amplifier according to claim 4, wherein said at least one additional resistor comprises a spanning resistor, and said first feedback resistor, said second feedback resistor, and said spanning resistor are configured to provide a programmable-gain amplifier configuration.

7. The differential input, differential output amplifier according to claim 1, wherein said compensation circuit comprises a switched-capacitor network for selectively cross-coupling said second pair of compensation capacitors.

8. The differential input, differential output amplifier according to claim 7, wherein said first pair of compensation capacitors have a capacitance value greater than a capacitance value of said second pair of compensation capacitors.

9. The differential input, differential output amplifier according to claim 7, wherein said switched-capacitor network comprises:
    a plurality of compensation capacitors including said second pair of compensation capacitors configured for selective cross-coupling;
    a plurality of transistor switches coupled to said plurality of compensation capacitors and configured to facilitate selective cross-coupling; and
    a plurality of inverters, each of said plurality of inverters being configured to receive a control signal and to drive a gate terminal of at least one of said plurality of transistor switches.

10. The differential input, differential output amplifier according to claim 9, wherein said switched capacitor network is configured to selectively couple said plurality of compensation capacitors to a compensation node of one of said first op-amp and said second op-amp.

11. The differential input, differential output amplifier according to claim 9, wherein said switched capacitor network is configured to selectively couple said plurality of compensation capacitors to one of said first output terminal and said second output terminal.

12. The differential input, differential output amplifier according to claim 9, said switched capacitor network comprising N compensation capacitors, N inverters, and 2N transistor switches where N is and integer, and wherein N of said 2N plurality of transistor switches are configured to receive a control signal.

13. The differential input, differential output amplifier according to claim 9, wherein said plurality of compensation capacitors are weighted.

14. An op-amp circuit comprising a differential input, differential output amplifier configured within a feedback loop of said op-amp, said differential input, differential output amplifier comprising:

a first op-amp having a first input terminal, a first compensation node, and a first output terminal;

a second op-amp having a second input terminal, a second compensation node, and a second output terminal;

a Miller compensation circuit comprising:

a first compensation capacitor coupled between said first compensation node and said first input terminal;

a second compensation capacitor coupled between said second compensation node and said second input terminal;

a third compensation capacitor cross-coupled from said first compensation node to said second input terminal; and a fourth compensation capacitor cross-coupled from said second compensation node to said first input terminal.

15. The op-amp according to claim 14, wherein said third compensation capacitor and said fourth compensation capacitor are selectively cross-coupled through a switched-capacitor network.

16. The op-amp according to claim 14, wherein said differential input, differential output amplifier is configured in a programmable-gain amplifier configuration.

17. A differential input, differential output amplifier configured for increasing differential mode gain bandwidth, said differential input, differential output amplifier comprising:

a pair of op-amps configured to provide a pair of differential input terminals and a pair of differential output terminals, and having a pair of compensation nodes;

a first pair of Miller compensation capacitors, with one compensation capacitor being coupled between a compensation node and a differential output terminal of one of said pair of op-amps, and a second compensation capacitor being coupled between a compensation node and a differential output terminal of another of said pair of op-amps;

at least one additional pair of Miller compensation capacitors, each capacitor of said at least one additional pair of Miller compensation capacitors being configured for cross-coupling to said compensation node of one of said pair of op-amps and said differential output terminal of another of said pair of op-amps to provide Miller de-compensation during differential mode operation.

18. The differential input, differential output amplifier according to claim 17, wherein said differential input, differential output amplifier comprises a programmable-gain amplifier configuration.

19. The differential input, differential output amplifier according to claim 17, wherein said at least one additional pair of Miller compensation capacitors can be selectively cross-coupled through a switched-capacitor network.

20. A Miller de-compensation method for facilitating increased differential mode gain bandwidth in a differential input, differential output amplifier, said method comprising the steps of:

coupling a first compensation capacitor between a first compensation node and a first output terminal of a first op-amp;

coupling a second compensation capacitor between a second compensation node and a second output terminal of a second op-amp;

cross-coupling a third compensation capacitor between a compensation node of one of said first op-amp and said second op-amp and an output terminal of a complementary one of said first op-amp and said second op-amp; and cross-coupling a fourth compensation capacitor between a compensation node of said complementary one of said first op-amp and said second op-amp and an output terminal of said one of said first op-amp and said second op-amp.

21. The method according to claim 20, wherein said steps of cross-coupling comprise selectively coupling said third compensation capacitor and said fourth compensation capacitor between said first compensation node and said second compensation node.

22. The method according to claim 20, wherein said steps of cross-coupling comprise selectively coupling said third compensation capacitor and said fourth compensation capacitor between said first output terminal and said second output terminal.

23. The method according to claim 20, wherein said method comprises the steps of selectively cross-coupling a first plurality of compensation capacitors in a switched-capacitor network to one of said first compensation node and said second compensation node and selectively cross-coupling a second plurality of compensation capacitors in said switched-capacitor network to another one of said first compensation node and said second compensation node.

24. The method according to claim 20, said method further comprising the step of providing a programmable-gain function in said differential input, differential output amplifier.

* * * * *